(12) United States Patent
Marks et al.

(10) Patent No.: US 9,778,561 B2
(45) Date of Patent: Oct. 3, 2017

(54) VACUUM-INTEGRATED HARDMASK PROCESSES AND APPARATUS

(71) Applicant: Lam Research Corporation, Fremont, CA (US)

(72) Inventors: Jeffrey Marks, Saratoga, CA (US); George Andrew Antonelli, Portland, OR (US); Richard A. Gottscho, Pleasanton, CA (US); Dennis M. Hausmann, Lake Oswego, CA (US); Adrien LaVoie, Newberg, OR (US); Thomas Joseph Knisley, Beaverton, OR (US); Sirish K. Reddy, Hillsboro, OR (US); Bhadri N. Varadarajan, Beaverton, OR (US); Artur Kolics, Dublin, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 208 days.

(21) Appl. No.: 14/610,038

(22) Filed: Jan. 30, 2015

(65) Prior Publication Data
US 2015/0221519 A1    Aug. 6, 2015

Related U.S. Application Data

(60) Provisional application No. 61/934,514, filed on Jan. 31, 2014.

(51) Int. Cl.
*B05D 3/06* (2006.01)
*G03F 1/76* (2012.01)
(Continued)

(52) U.S. Cl.
CPC ............ *G03F 1/76* (2013.01); *C23C 18/14* (2013.01); *C23C 18/165* (2013.01);
(Continued)

(58) Field of Classification Search
CPC ..... C23C 18/06; C23C 18/08; C23C 18/1275; C23C 18/14; C23C 18/1612;
(Continued)

(56) References Cited

U.S. PATENT DOCUMENTS 3,513,010 A * 5/1970 Notley .................. B41M 5/124
                                                                                                                    101/18
3,529,963 A * 9/1970 Marchese .............. G03C 1/498
                                                                                                                    430/353

(Continued)

FOREIGN PATENT DOCUMENTS

JP         2003-213001 A     7/2003
TW      201241555 A1    10/2012

OTHER PUBLICATIONS

S.P. Pappas, editor; "Light Sources" by Vincent D. McGinniss, in UV Curing: Science and Technology; technology marketing Corporation, 642 Westover Rd., Stamford, CT, USA; 1978 (no month); pp. 96-129.*

(Continued)

*Primary Examiner* — Marianne L Padgett
(74) *Attorney, Agent, or Firm* — Weaver Austin Villeneuve & Sampson LLP

(57) ABSTRACT

Vacuum-integrated photoresist-less methods and apparatuses for forming metal hardmasks can provide sub-30 nm patterning resolution. A metal-containing (e.g., metal salt or organometallic compound) film that is sensitive to a patterning agent is deposited on a semiconductor substrate. The metal-containing film is then patterned directly (i.e., without the use of a photoresist) by exposure to the patterning agent in a vacuum ambient to form the metal mask. For example, the metal-containing film is photosensitive and the patterning is conducted using sub-30 nm wavelength optical lithography, such as EUV lithography.

9 Claims, 3 Drawing Sheets

(51) Int. Cl.
C23C 18/14 (2006.01)
C23C 18/16 (2006.01)
C23C 18/18 (2006.01)
H01L 21/033 (2006.01)
H01L 21/3213 (2006.01)
G03F 7/004 (2006.01)
G03F 7/16 (2006.01)

(52) U.S. Cl.
CPC ........ C23C 18/1612 (2013.01); C23C 18/182 (2013.01); G03F 7/0043 (2013.01); G03F 7/16 (2013.01); G03F 7/167 (2013.01); H01L 21/0332 (2013.01); H01L 21/0337 (2013.01); H01L 21/3213 (2013.01)

(58) Field of Classification Search
CPC ............ C23C 18/1633; C23C 18/1642; C23C 18/165; C23C 18/1667; C23C 18/1813; C23C 18/1817; C23C 18/182; C23C 18/1862; C23C 18/1865; C23C 18/1868; H01L 21/0332; H01L 21/0337; H01L 21/3213; G03F 1/76
USPC ............... 427/551–556, 96.1–99.5, 301–306
See application file for complete search history.

(56) References Cited

U.S. PATENT DOCUMENTS

| | | | |
|---|---|---|---|
| 3,720,515 A * | 3/1973 | Stanley | G03C 1/4965 430/313 |
| 4,328,298 A * | 5/1982 | Nester | G03F 1/22 216/100 |
| 5,077,085 A * | 12/1991 | Schnur | C23C 18/1882 257/E21.174 |
| 5,534,312 A * | 7/1996 | Hill | C23C 18/14 427/270 |
| 6,162,577 A | 12/2000 | Felter et al. | |
| 6,261,938 B1 * | 7/2001 | Beauvais | B82Y 10/00 438/607 |
| 9,023,731 B2 | 5/2015 | Ji et al. | |
| 9,551,924 B2 * | 1/2017 | Burkhardt | G03F 1/24 |
| 2004/0113087 A1 * | 6/2004 | Ikeda | G21K 4/00 250/370.09 |
| 2004/0175631 A1 * | 9/2004 | Crocker | B82Y 10/00 430/5 |
| 2004/0191423 A1 * | 9/2004 | Ruan | C23C 18/06 427/554 |
| 2005/0208389 A1 * | 9/2005 | Ishibashi | B82Y 10/00 430/5 |
| 2005/0253077 A1 * | 11/2005 | Ikeda | H01L 27/14676 250/370.09 |
| 2006/0001064 A1 * | 1/2006 | Hill | C23C 18/06 257/295 |
| 2006/0068173 A1 * | 3/2006 | Kajiyama | B05C 3/10 428/195.1 |
| 2006/0147818 A1 * | 7/2006 | Lee | B82Y 10/00 430/5 |
| 2006/0175558 A1 * | 8/2006 | Bakker | G03F 7/70175 250/492.2 |
| 2007/0181816 A1 * | 8/2007 | Ikeda | H01L 27/14603 250/370.14 |
| 2009/0208880 A1 | 8/2009 | Nemani et al. | |
| 2010/0197135 A1 * | 8/2010 | Ishizaka | H01L 21/28556 438/653 |
| 2011/0104595 A1 * | 5/2011 | Hayashi | B82Y 10/00 430/5 |
| 2014/0170563 A1 * | 6/2014 | Hatakeyama | G03F 7/40 430/285.1 |
| 2014/0170853 A1 | 6/2014 | Shamma et al. | |
| 2016/0314964 A1 | 10/2016 | Tang et al. | |
| 2017/0146909 A1 | 5/2017 | Smith et al. | |

OTHER PUBLICATIONS

Coons, R.W. et al., "Comparison of EUV spectral and ion emission features from laser-produced Sn and Li plasmas," Extreme Vultrviolet (EUV) Lithography, Proc. of SPIE vol. 7636, © 2010 SPIE, pp. 763636-1 to 763636-7.

Spitzer, R.C. et al., "Conversion efficiencies from laser-produced plasmas in the extreme ultraviolet regime," J. Appl. Phys. 79 (5) Mar. 1, 1996. p. 2251-2258.

Gerritsen, H.C. et al., "Laser-generated plasma as soft x-ray source," J. Appl. Phys. 59 (7), Apr. 1, 1986, p. 2337-2344.

U.S. Appl. No. 14/692,627, "Gap fill using carbon-based films," Tang et al., filed Apr. 21, 2015.

Chinese First Office Action dated May 24, 2017 issued in Application No. CN 201510053668.7.

Fan, Y. et al., (2016) "Benchmarking Study of EUV Resists for NXE:3300B," Proc. of SPIE, 9776:97760W-1 to 97760W-11 [Downloaded From http://proceedings.spiedigitallibrary.org/ on Mar. 30, 2017].

Gangnaik, A.S. et al., (2017) "New Generation Electron Beam Resists: A Review," Chem. Mater., 29:1898-1917, Jan. 12, 2017.

U.S. Appl. No. 15/432,634, filed Feb. 14, 2017, Smith et al.

U.S. Appl. No. 15/495,701, filed Apr. 24, 2017, Smith et al.

* cited by examiner

VACUUM-INTEGRATED HARDMASK PROCESSES AND APPARATUS

CROSS-REFERENCE TO RELATED APPLICATIONS

This application claims priority to U.S. Provisional Patent Application No. 61/934,514 filed Jan. 31, 2014, titled VACUUM-INTEGRATED HARDMASK PROCESSES, which is incorporated herein by reference in its entirety and for all purposes.

BACKGROUND

This disclosure relates generally to the field of semiconductor processing. In particular, the disclosure is directed to vacuum-integrated processes for forming metal hardmasks without the use of photoresist.

Patterning of thin films in semiconductor processing is often a critical step in the manufacture and fabrication of semiconductors. Patterning involves lithography. In conventional photolithography, such as 193 nm photolithography, patterns are printed by emitting photons from a photon source onto a mask and printing the pattern onto a photosensitive photoresist, thereby causing a chemical reaction in the photoresist that, after development, removes certain portions of the photoresist to form the pattern.

Advanced technology nodes (as defined by the International Technology Roadmap for Semiconductors) include nodes 22 nm, 16 nm, and beyond. In the 16 nm node, for example, the width of a typical via or line in a Damascene structure is typically no greater than about 30 nm. Scaling of features on advanced semiconductor integrated circuits (ICs) and other devices is driving lithography to improve resolution.

SUMMARY

Aspects of the present invention are directed to vacuum-integrated photoresist-less methods and apparatuses for forming metal hardmasks. Such methods and apparatuses can provide sub-30 nm patterning resolution. Generally, a metal-containing (e.g., metal salt or organometallic compound) film that is sensitive to patterning agent such as photons, electrons, protons, ions or neutral species such that the film can be patterned by exposure to one of these species is deposited on a semiconductor substrate. The metal-containing film is then patterned directly (i.e., without the use of a photoresist) by exposure to the patterning agent in a vacuum ambient to form the metal mask. For example, the metal-containing film is photosensitive and the patterning is conducted using optical lithography, such as EUV lithography.

In one implementation, a EUV-sensitive metal-containing film is deposited on a semiconductor substrate. The metal-containing film is then patterned directly by EUV exposure in a vacuum ambient to form the metal hardmask. In this way, a vacuum-integrated metal hardmask process and related vacuum-integrated hardware that combine steps of film formation (condensation/deposition) and optical lithography with the result of greatly improved EUV lithography (EUVL) performance—e.g. reduced line edge roughness—is provided. By using a metal-containing hardmask and by directly patterning the metal-containing film using the EUV photon flux, the process entirely avoids the need for photoresist.

In another implementation, an apparatus for conducting photoresist-less metal hardmask formation can provide the vacuum integration to conduct the described processes. The apparatus includes a metal-containing film deposition module, a metal-containing film patterning module, and a vacuum transfer module connecting the deposition module and the patterning module.

These and other features and advantages of the invention will be described in more detail below with reference to the associated drawings.

DETAILED DESCRIPTION

Figure 1A:
FIGS. 1A-E illustrate a representative process flow for a vacuum-integrated photoresist-less hardmask formation process.

Reference will now be made in detail to specific embodiments of the invention. Examples of the specific embodiments are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the spirit and scope of the invention. In the following description, numerous specific details are set forth in order to provide a thorough understanding of the present invention. The present invention may be practiced without some or all of these specific details. In other instances, well known process operations have not been described in detail so as to not unnecessarily obscure the present invention.

INTRODUCTION

Extreme ultraviolet (EUV) lithography can extend lithographic technology beyond its optical limits by moving to smaller imaging source wavelengths achievable with current photolithography methods to pattern small critical dimension features. EUV light sources at approximately 13.5 nm wavelength can be used for leading-edge lithography tools, also referred to as scanners. The EUV radiation is strongly absorbed in a wide range of solid and fluid materials including quartz and water vapor, and so operates in a vacuum.

EUV lithography typically makes use of an organic hardmask (e.g., an ashable hardmark of PECVD amorphous hydrogenated carbon) that is patterned using a conventional photoresist process. During photoresist exposure, EUV radiation is absorbed in the resist and in the substrate below, producing highly energetic photoelectrons (about 100 eV) and in turn a cascade of low-energy secondary electrons (about 10 eV) that diffuse laterally by several nanometers. These electrons increase the extent of chemical reactions in the resist which increases its EUV dose sensitivity. However, a secondary electron pattern that is random in nature is superimposed on the optical image. This unwanted secondary electron exposure results in loss of resolution, observable line edge roughness (LER) and linewidth variation in the patterned resist. These defects are replicated in the material to be patterned during subsequent pattern transfer etching.

Unlike an insulator such as photoresist, a metal is less susceptible to secondary electron exposure effects since the secondary electrons can quickly lose energy and thermalize by scattering with conduction electrons. Suitable metal elements for this process may include but are not limited to: aluminum, silver, palladium, platinum, rhodium, ruthenium, iridium, cobalt, ruthenium, manganese, nickel, copper, hafnium, tantalum, tungsten, gallium, germanium, tin, antimony, or any combination thereof.

However, electron scattering in the photoresist used to pattern a blanket metal film into a mask would still lead to unacceptable effects such as LER.

A vacuum-integrated metal hardmask process and related vacuum-integrated hardware that combines film formation (deposition/condensation) and optical lithography with the result of greatly improved EUV lithography (EUVL) performance—e.g. reduced line edge roughness—is disclosed. By using a metal-containing hardmask film and by directly patterning the metal-containing film using the EUV photon flux, the process entirely avoids the need for photoresist.

In various embodiments, a deposition (e.g., condensation) process (e.g., ALD or MOCVD carried out in a PECVD tool, such as the Lam Vector®) can be used to form a thin film of a metal-containing film, such a photosensitive metal salt or metal-containing organic compound (organometallic compound), with a strong absorption in the EUV (e.g., at wavelengths on the order of 10-20 nm), for example at the wavelength of the EUVL light source (e.g., 13.5 nm=91.8 eV). This film photo-decomposes upon EUV exposure and forms a metal mask that is the pattern transfer layer during subsequent etching (e.g., in a conductor etch tool, such as the Lam 2300® Kiyo®).

The metal-containing film can be deposited in a chamber integrated with a lithography platform (e.g., a wafer stepper such as the TWINSCAN NXE: 3300B® platform supplied by ASML of Veldhoven, NL) and transferred under vacuum so as not to react before exposure. Integration with the lithography tool is facilitated by the fact that EUVL also requires a greatly reduced pressure given the strong optical absorption of the incident photons by ambient gases such as $H_2O$, $O_2$, etc.

In some embodiments, a selective film deposition can be carried out after the EUV exposure/decomposition step to increase the thickness of the mask material if needed for optical or mechanical reasons; a process referred to as pattern amplification. Viewed in this context, the initial hardmask then serves as a seed layer upon which the final mask is formed, similar to the use of a metal seed layer for electroless (ELD) or electrochemical (ECD) deposition.

Vacuum-Integrated Photoresist-Less Metal Hardmask Formation Processes

FIGS. 1A-E illustrate a representative process flow for a vacuum-integrated photoresist-less hardmask formation process. Generally, a metal-containing film that is sensitive to a patterning agent such as photons, electrons, protons, ions or neutral species such that the film can be patterned by exposure to one of these species is deposited on a semiconductor substrate. The metal-containing film is then patterned directly (i.e., without the use of a photoresist) by exposure to the patterning agent in a vacuum ambient to form the metal mask. This description references primarily metal-containing films, particularly where the metal is Sn, that are patterned by extreme ultraviolet lithography (EUV lithography (EUVL)), particularly EUVL having an EUV source which uses excited Sn droplets. Such films are referred to herein as EUV-sensitive films. However, it should be understood that other implementations are possible, including different metal-containing films and patterning agents/techniques.

Figure 2:
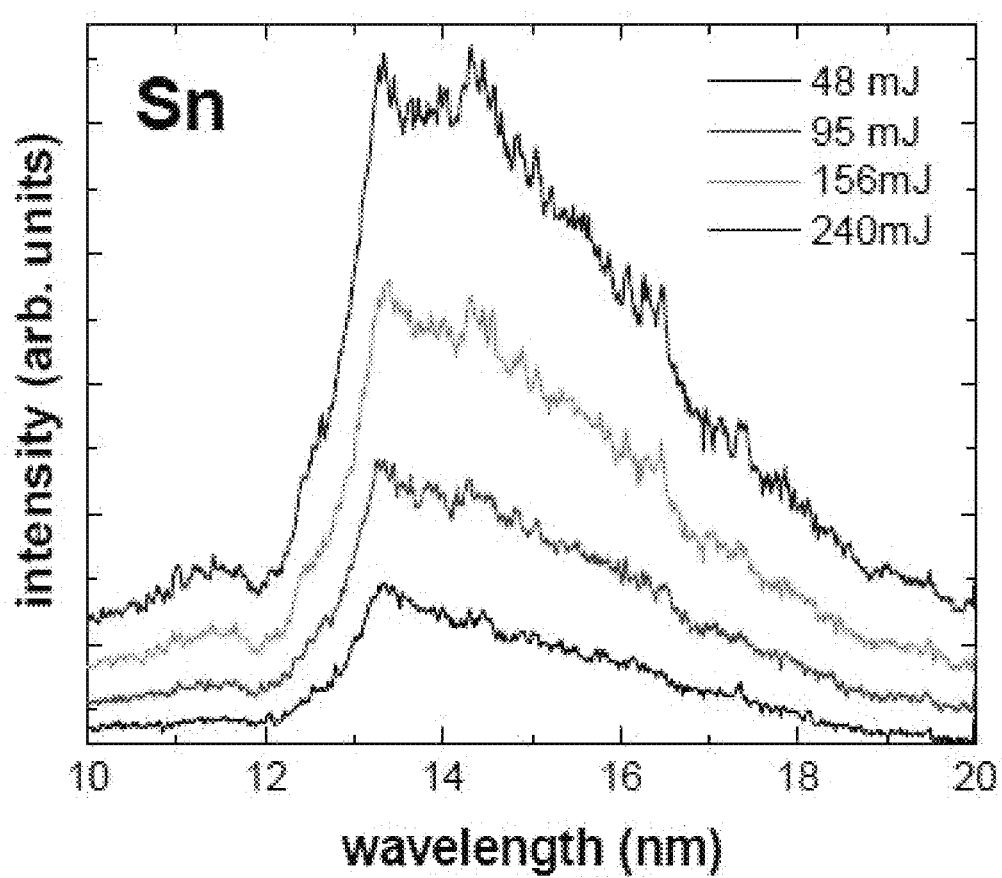
FIG. 2 provides the emission spectrum of a EUV source which uses excited Sn droplets.

A desirable hardmask metal will be a strong absorber and will have a relatively broad absorption profile, high melting point, low malleability/high physical stability and be readily deposited. For the purposes of this disclosure, it is important to note that a material that emits a photon of a given energy will also absorb a photon of that energy. Strongly absorbed light will result in the desired decomposition or will otherwise sensitize the film so that the exposed areas can be removed with heat, wet chemistry, etc. FIG. 2 provides the emission spectrum of a EUV source which uses excited Sn droplets. See, R. W. Coons, et al., "Comparison of EUV spectral and ion emission features from laser produced Sn and Li plasmas", Proc. Of SPIE Vol. 7636 73636-1 (2010); R. C. Spitzer, et al., "Conversion efficiencies from laser-produced plasmas in the extreme ultraviolet region", 79 J. Appl. Phys., 2251 (1996); and H. C. Gerritsen, et al., "Laser-generated plasma as soft x-ray source", J. Appl. Phys. 59 2337 (1986), incorporated herein by reference for their disclosure relating to the emission/absorption properties of various metals. The emitted photons are on the order of 13.5 nm or 91.8 eV. Therefore, Sn is a desirable hardmask metal for this application.

Referring to FIG. 1A, a semiconductor substrate to be patterned 100 is shown. In a typical example, the semiconductor substrate 100 is a silicon wafer including partially-formed integrated circuits.

Figure 1B:

FIG. 1B illustrates a metal-containing film 102 that is sensitive to a patterning agent deposited on the semiconductor substrate 100. The metal-containing film may be a metal salt, for example a metal halide, or an organometallic compound sensitive to exposure to a patterning agent such that the metal-containing film gets decomposed to the base metal or is rendered sensitive to a subsequent development process. Suitable patterning agents may be photons, electrons, protons, ions or neutral species, such that the metal-containing film 102 can be patterned by exposure to one of these species by decomposition to the base metal or is rendered sensitive to a subsequent development process. As further explained below, a particular example of an effective metal and patterning agent combination is Sn, deposited as a metal halide (e.g., $SnBr_4$) or organometallic (e.g., $Sn(CH_3)_4$), patterned by EUV lithography. In general, prior to the deposition, the semiconductor substrate 100 is placed in a reactor chamber for metal-containing film deposition under vacuum.

A blanket of the metal-containing film 102 can be formed by condensation from a suitable precursor (e.g., in a non-plasma CVD reactor, such as an Altus® CVD tool, available from Lam Research Corporation, Fremont, Calif.). For example, tin bromide, $SnBr_4$, has a normal boiling point of 205° C. and a melting point of 31° C. at 760 Torr, and a vapor pressure of 10 Torr at 10° C. It can be condensed onto the substrate to form a solid $SnBr_4$ film with a thickness that depends on exposure time and substrate temperature, for example on the order of 5 to 200 nm, e.g., 10 nm. Suitable process conditions for this deposition via condensation include a deposition temperature between about 0 and 30° C., for example about 20° C., and a reactor pressure of less than 20 Torr, for example maintained between 14 and 15

Torr at 20° C. Maintaining the precursor flow rate between about 100 and 1000 sccm allows for control of the deposition rate.

An alternative source of Sn metal may be organometallic. For example, tetramethyl tin ($Sn(CH_3)_4$) has a normal boiling point of 75° C. and a melting point of −54° C. at 760 Torr. It can be also be condensed onto the substrate to form a solid $Sn(CH_3)_4$ film with a thickness that depends on exposure time and substrate temperature, for example on the order of 5 to 200 Å, e.g., 100 Å. Suitable process conditions for this deposition via condensation include a deposition temperature between about −54° C. and 30° C., for example about 20° C., and a reactor pressure of less than 20 Torr, for example maintained at about 1 Torr at 20° C. Maintaining the precursor flow rate between about 100 and 1000 sccm allows for control of the deposition rate.

Another suitable metal for formation of the metal mask is hafnium (Hf). Hafnium chloride, $HfCl_4$ (1 Torr vapor pressure at 190° C. with a melting point of 432° C.) can be condensed onto the substrate to form a solid $HfCl_4$ crystalline film with a thickness that depends on exposure time and substrate temperature, for example on the order of 50 to 2000 nm, e.g., 1000 nm. Suitable process conditions for this deposition via condensation include a deposition temperature between about 0 and 300° C., for example about 100° C., and a reactor pressure of less than 10 Torr, for example maintained between 0.1 and 1 Torr at 100° C. Maintaining the precursor flow rate between about 10 and 100 sccm allows for control of the deposition rate.

To prevent degradation due to water vapor, formation and transfer of the Sn- and Hf-containing films is conducted in a vacuum-ambient. The formed film is then transferred to a EUV patterning tool and patterned via direct exposure, without the use of a photoresist, as illustrated in FIGS. 1C-D.

It should be noted that a EUVL tool typically operates at a higher vacuum than a deposition tool. If this is the case, it is desirable to increase the vacuum environment of the substrate during the transfer from the deposition to the patterning tool to allow the substrate and deposited metal-containing film to degas prior to entry into the patterning tool. This is so that the optics of the patterning tool are not contaminated by off-gassing from the substrate.

Figure 1C:
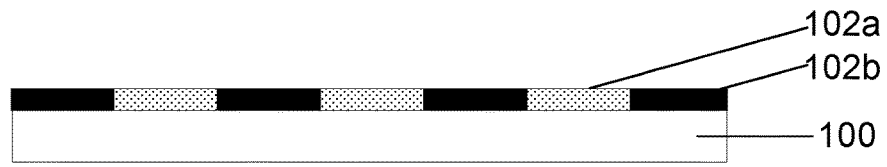
Figure 1D:
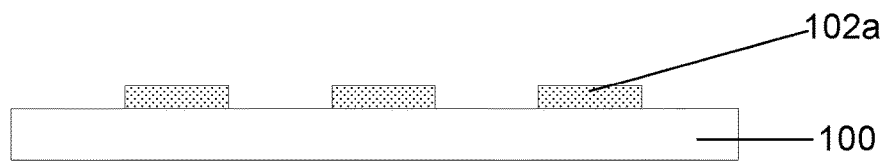

Referring to FIG. 1C, for metal halide Sn-based metal-containing films patterned by EUVL, the decomposition chemistry can proceed by:

$$SnBr_4 \rightarrow Sn + 2Br_2.$$

Photons directly decompose the $SnBr_4$ to Sn (tin metal) and bromine gas ($Br_2$). Alternatively, a reactant $X_2$ (e.g., wherein X is Cl, I or H) could be used to promote a reaction pathway $SnBr_4 + X_2 \rightarrow SnX_4 + 2Br_2$, and ultimately to Sn by photodecomposition, in particular where $SnX_4$ is easier to photoactivate than the easily condensed $SnBr_4$. In either case, the byproducts ($Br_2$) and reactants ($X_2$) require containment, such as vacuum.

For organometallic Sn-based metal-containing films patterned by EUVL, photons directly decompose the $Sn(CH_3)_4$ to Sn (tin metal) and ethane gas, the decomposition chemistry proceeding by:

$$Sn(CH_3)_4 \rightarrow Sn + 2C_2H_6.$$

For metal halide Hf-based metal-containing films patterned by EUVL, the decomposition chemistry can proceed by:

$$HfCl_4 \rightarrow Hf + 2Cl_2.$$

Photons directly decompose the $HfCl_4$ to Hf metal and chlorine gas ($Cl_2$). Alternatively, a reactant $X_2$ (e.g., wherein X is Br, I or H) could be used to promote a reaction pathway $HfCl_4 + X_2 \rightarrow HfX_4 + 2Cl_2$, and ultimately to Hf by photodecomposition, in particular where $HfX_4$ is easier to photoactivate than the easily condensed $HfCl_4$. In either case, the byproducts ($Cl_2$) and reactants ($X_2$) require containment, such as vacuum.

As shown in FIG. 1C, the patterning results in exposed metal-containing film regions of formed metal mask 102a and unexposed regions 102b of material to be removed by pattern development.

Referring to FIG. 1D, the pattern can then be developed. Development of the pattern can occur simply by heating the substrate to volatilize the unexposed regions 102b of the metal-containing film, so that only the exposed regions 102a remain as a fully-formed metal mask. It should be noted that this pattern development operation may not require vacuum integration since a thermally and environmentally stable patterned metal mask would have been formed. It may also be desirable to conduct the pattern development outside the patterning tool to avoid contaminating the tool optics with any incompatible byproducts of the metal-containing film decomposition.

Figure 1E:
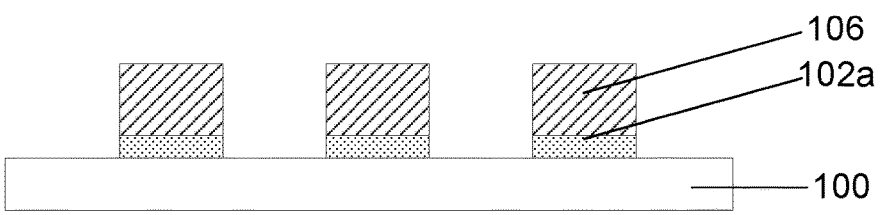

Referring to FIG. 1E, as an optional step, a pattern amplification can be done. For example selective ALD or electroless deposition (ELD) may be performed on the patterned substrate following the operations depicted in FIGS. 1C and/or 1D to build up the thickness of the metal mask with additional selectively deposited metal 106. This may be helpful to reduce optical transmission of the mask or make it more mechanically robust. Such amplification may be accomplished, for example, by adaptation of an electroless deposition process such as that described in U.S. Pat. Nos. 6,911,067, 6,794,288, 6,902,605 and 4,935,312, the disclosures of which in this regard are incorporated by reference herein.

For example, an initial 1 nm seed could be amplified to 10 nm in this way. Like the pattern development discussed with reference to FIG. 1D, this operation may not require vacuum integration since a thermally and environmentally stable patterned metal mask would have been formed before amplification.

Alternative Process Embodiments

As an alternative to the metal salt or organometallic metal-containing film depositions, a metal-containing EUV-sensitive film could be deposited by a multistep process of metalorganic CVD using a suitable precursor (e.g., in a non-plasma CVD reactor, such as an Altus® CVD tool or PECVD reactor, such a Vector® PECVD tool, both available from Lam Research Corporation, Fremont, Calif.). For example, a plasma deposition of alkyl and amino precursors, such as a $CH_4/H_2$ plasma deposition followed by an ammonia ($NH_3/H_2$) plasma, can produce an amino-functionalized self-assembled monolayer (SAM) of aminopropyltriethoxysilane (APTES) on a semiconductor substrate. Such amine terminated surfaces enable conformal electroless deposition (ELD). The SAM can then be transferred to a EUV patterning tool and patterned. Selective growth of the patterned SAM by ELD, such as by $PdCl_2/H_2O$ solution exposure to provide a Pd catalyst, followed by ELD of Ni or Co and then copper (Cu) according to processes known in the art given these parameters, results in a metal-based mask formed without the use of photoresist. Such a SAM-based approach can also be used for pattern amplification as an alternative to the ELD technique described with ref to FIG. 1E for that purpose.

It should also be noted that while this disclosure primarily references EUVL as a patterning technique, alternative embodiments could use a focused beam of electrons, ions or neutral species to directly write the pattern onto the blanket mask, these steps also performed in vacuum. In-situ chamber cleaning may be used if byproducts condense on the reflective optics of the EUVL system.

Apparatus

Figure 3:
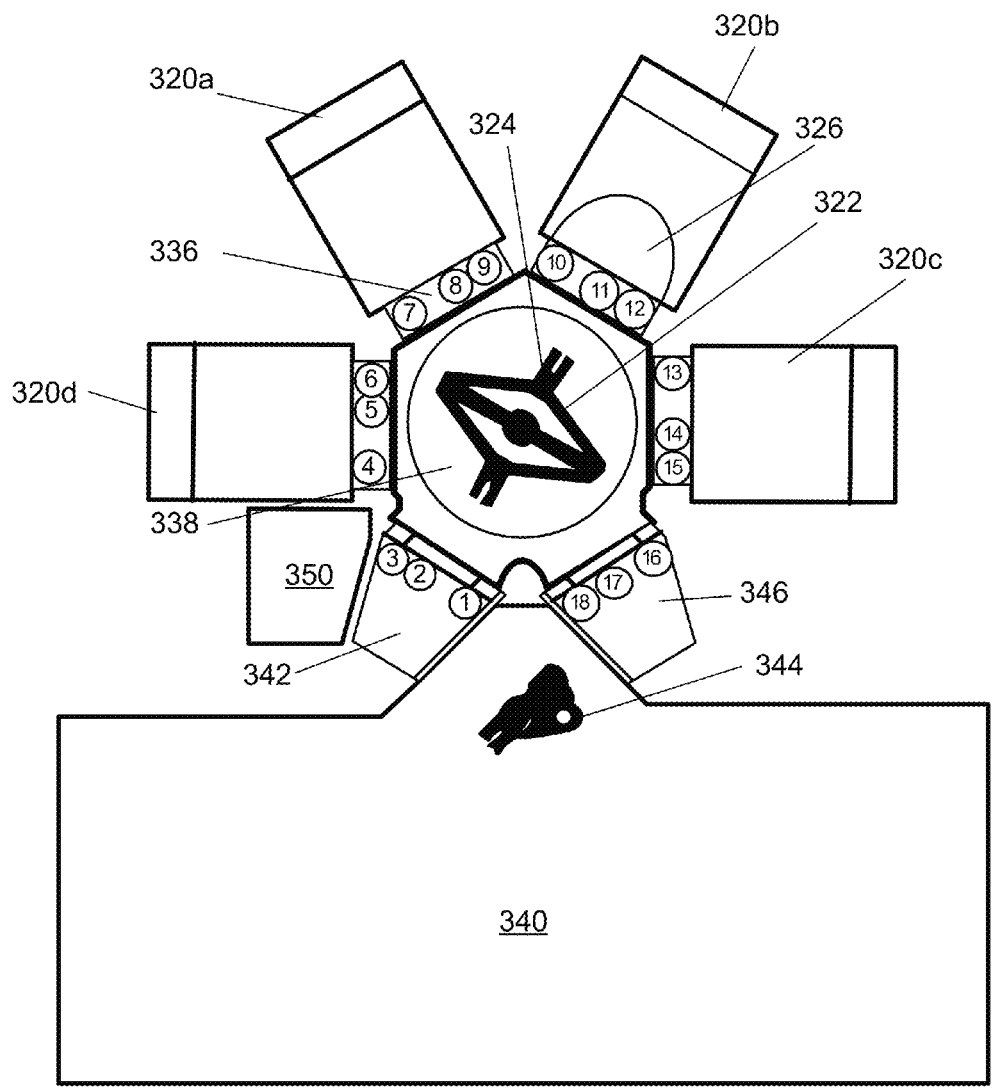
FIG. 3 depicts a semiconductor process cluster architecture with metal deposition and patterning modules that interface with a vacuum transfer module, suitable for implementation of the vacuum-integrated processes described herein.

FIG. 3 depicts a semiconductor process cluster tool architecture with vacuum-integrated metal deposition and patterning modules that interface with a vacuum transfer module, suitable for implementation of the vacuum-integrated processes described herein. The arrangement of transfer modules to "transfer" wafers among multiple storage facilities and processing modules may be referred to as a "cluster tool architecture" system. Metal deposition and patterning modules are vacuum-integrated, in accordance with the requirements of a particular process. A vacuum transport module (VTM) 338 interfaces with four processing modules 320a-320d, which may be individually optimized to perform various fabrication processes. By way of example, processing modules 320a-320d may be implemented to perform condensation, deposition, evaporation, ELD, etch, and/or other semiconductor processes. For example, module 320a may be a non-plasma CVD reactor, such as an Altus® CVD tool, available from Lam Research Corporation, Fremont, Calif. suitable for conducting deposition of metal-containing films, as described herein. And module 320b may be a PECVD tool, such as the Lam Vector®. It should be understood that the figure is not necessarily drawn to scale.

Airlocks 342 and 346, also known as a loadlocks or transfer modules, interface with the VTM 338 and a patterning module 340. For example, a suitable patterning module may be the TWINSCAN NXE: 3300B® platform supplied by ASML of Veldhoven, NL). This tool architecture allows for work pieces, such as substrates with deposited metal-containing films, to be transferred under vacuum so as not to react before exposure. Integration of the deposition modules with the lithography tool is facilitated by the fact that EUVL also requires a greatly reduced pressure given the strong optical absorption of the incident photons by ambient gases such as $H_2O$, $O_2$, etc.

Airlock 342 may be an "outgoing" loadlock, referring to the transfer of a substrate out from the VTM 338 serving a deposition module 620a to the patterning module 340, and airlock 346 may be an "ingoing" loadlock, referring to the transfer of a substrate from the patterning module 340 back in to the VTM 338. The ingoing loadlock 346 may also provide an interface to the exterior of the tool for access and egress of substrates. Each process module has a facet that interfaces the module to VTM 338. For example, deposition process module 320a has facet 336. Inside each facet, sensors, for example, sensors 1-18 as shown, are used to detect the passing of wafer 326 when moved between respective stations. Patterning module 340 and airlocks 342 and 346 may be similarly equipped with additional facets and sensors, not shown.

Main VTM robot 322 transfers wafer 326 between modules, including airlocks 342 and 346. In one embodiment, robot 322 has one arm, and in another embodiment, robot 322 has two arms, where each arm has an end effector 324 to pick wafers such as wafer 326 for transport. Front-end robot 344, it is used to transfer wafers 326 from outgoing airlock 342 into the patterning module 340, from the patterning module 340 into ingoing airlock 346. Front-end robot 344 may also transport wafers 326 between the ingoing loadlock and the exterior of the tool for access and egress of substrates. Because ingoing airlock module 346 has the ability to match the environment between atmospheric and vacuum, the wafer 326 is able to move between the two pressure environments without being damaged.

It should be noted that a EUVL tool typically operates at a higher vacuum than a deposition tool. If this is the case, it is desirable to increase the vacuum environment of the substrate during the transfer from the deposition to the patterning tool to allow the substrate and deposited metal-containing film to degas prior to entry into the patterning tool. Outgoing airlock 342 may provide this function by holding the transferred wafers at a lower pressure, no higher than the pressure in the patterning module 340, for a period of time and exhausting any off-gassing, so that the optics of the patterning tool 340 are not contaminated by off-gassing from the substrate. A suitable pressure for the outgoing, off-gassing airlock is no more than 1E-8 Torr.

In some embodiments, a system controller 350 (which may include one or more physical or logical controllers) controls some or all of the operations of the cluster tool and/or its separate modules. It should be noted that the controller can be local to the cluster architecture, or can be located external to the cluster architecture in the manufacturing floor, or in a remote location and connected to the cluster architecture via a network. The system controller 650 may include one or more memory devices and one or more processors. The processor may include a central processing unit (CPU) or computer, analog and/or digital input/output connections, stepper motor controller boards, and other like components. Instructions for implementing appropriate control operations are executed on the processor. These instructions may be stored on the memory devices associated with the controller or they may be provided over a network. In certain embodiments, the system controller executes system control software.

The system control software may include instructions for controlling the timing of application and/or magnitude of any aspect of tool or module operation. System control software may be configured in any suitable way. For example, various process tool component subroutines or control objects may be written to control operations of the process tool components necessary to carry out various process tool processes. System control software may be coded in any suitable compute readable programming language. In some embodiments, system control software includes input/output control (IOC) sequencing instructions for controlling the various parameters described above. For example, each phase of a semiconductor fabrication process may include one or more instructions for execution by the system controller. The instructions for setting process conditions for condensation, deposition, evaporation, patterning and/or etching phase may be included in a corresponding recipe phase, for example.

CONCLUSION

The vacuum-integration of film deposition and lithography processes and apparatus described herein provides EUV-sensitive metal film deposition and subsequently patterning directly by direct EUV exposure in a vacuum ambient to prevent their decomposition or degradation. EUVL is done in a vacuum to avoid degradation of the incident 13.5 nm light flux by optical absorption of ambient gases. Among the advantages of described vacuum-integrated hardmask processes are: Vacuum operation of the EUV system opens up the possibility of using compounds that are oxygen and moisture sensitive; vacuum integration of the deposition system with the EUV system in an apparatus enables use of these materials. Photo decomposition of a metal precursor creates a non-linear reaction where the photo decomposition is enhanced by the increased adsorption of the metal film. Metals are better at thermalization of high energy secondary electrons than photoresist, thereby improving contrast or LER. Using metal film directly as masks or with pattern amplification allows much thinner films and reduce required exposure times. Metal films make better hardmasks for etch and decrease the thickness required from a mask perspective. Moreover, further development and optimization of materials compatible with the EUV vacuum and optics, organometallic precursors with appropriate dose thresholds for metal deposition, and nucleation films with multiple photo decomposition events to eliminate a nucleation site in a given space may proceed in accordance with the processes described herein.

It is understood that the examples and embodiments described herein are for illustrative purposes only and that various modifications or changes in light thereof will be suggested to persons skilled in the art. Although various details have been omitted for clarity's sake, various design alternatives may be implemented. Therefore, the present examples are to be considered as illustrative and not restrictive, and the invention is not to be limited to the details given herein, but may be modified within the scope of the appended claims.

What is claimed is:

1. A photoresist-less method of forming a metal mask, comprising:
    depositing on a semiconductor substrate a EUV-sensitive metal-containing film of solid $SnBr_4$ having a thickness of between 5 and 200 nm;
    patterning the metal-containing film with sub-30 nm resolution directly by EUV exposure having a wavelength in the range of 10 to 20 nm in a vacuum ambient; and
    developing the pattern to form the metal mask.

2. The method of claim 1, wherein the semiconductor substrate is a silicon wafer including partially-formed integrated circuits, and the method further comprising:
    prior to the deposition, providing the semiconductor substrate in a first reactor chamber for the metal-containing film deposition; and
    following the deposition, transferring the substrate under vacuum to a lithography processing chamber for the patterning.

3. The method of claim 2, further comprising, prior to entering the lithography processing chamber, outgassing the substrate.

4. The method of claim 3, wherein the outgassing comprises reducing the pressure surrounding the substrate to no more than 1E-8 Torr.

5. The method of claim 1, further comprising pattern amplification by selective deposition on the metal mask.

6. The method of claim 5, wherein the selective deposition comprises electroless deposition.

7. The method of claim 1, wherein the EUV exposure has a wavelength of 13.5 nm.

8. The method of claim 1, wherein the metal mask is formed on the substrate that is a silicon wafer including partially-formed integrated circuits.

9. The method of claim 1, wherein the development of the pattern comprises heating the substrate to volatilize unexposed regions of the metal-containing film.

* * * * *